United States Patent
Hendrickson et al.

(10) Patent No.: US 11,460,513 B2
(45) Date of Patent: Oct. 4, 2022

(54) ASSESSMENT OF CELL GROUP HEALTH IN A BATTERY PACK

(71) Applicant: GM GLOBAL TECHNOLOGY OPERATIONS LLC, Detroit, MI (US)

(72) Inventors: James D. Hendrickson, Oxford, MI (US); Jeffrey A. Tymitz, Bruce Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 43 days.

(21) Appl. No.: 17/121,814

(22) Filed: Dec. 15, 2020

(65) Prior Publication Data

US 2022/0187383 A1    Jun. 16, 2022

(51) Int. Cl.
*G01R 31/392*    (2019.01)
*H02J 7/00*    (2006.01)
*G01R 31/3835*    (2019.01)

(52) U.S. Cl.
CPC ....... *G01R 31/392* (2019.01); *G01R 31/3835* (2019.01); *H02J 7/005* (2020.01); *H02J 7/0013* (2013.01); *H02J 7/0048* (2020.01)

(58) Field of Classification Search
None
See application file for complete search history.

(56) References Cited

U.S. PATENT DOCUMENTS

| 6,532,425 B1* | 3/2003 | Boost | G01R 31/3648 320/136 |
| 2009/0023053 A1* | 1/2009 | Berdichevsky | H02J 7/0026 429/61 |
| 2009/0099799 A1* | 4/2009 | Barsoukov | G01R 31/382 702/63 |
| 2018/0131030 A1* | 5/2018 | Matsuura | H01M 10/0585 |

FOREIGN PATENT DOCUMENTS

WO    WO-2020260623 A1 * 12/2020    ............. B60L 58/18

OTHER PUBLICATIONS

Deutschen et al. "Modeling the self-discharge by voltage decay of a NMC/graphite lithium-ion cell", Jul. 25, 2018, Journal of Energy Storage, v19, pp. 113-119 (Year: 2018).*

\* cited by examiner

*Primary Examiner* — Brent A. Fairbanks
(74) *Attorney, Agent, or Firm* — Quinn IP Law

(57) ABSTRACT

A system for assessing health of a cell group within a module of a battery pack includes a controller having a processor and tangible, non-transitory memory on which instructions are recorded. One or more sensors are configured to obtain a series of respective average cell group voltages at different stages. The controller is adapted to obtain a measured voltage ($V_M$) of the cell group at a calibration event occurring after the third stage. The controller is adapted to calculate a predicted voltage ($V_P$) of the cell group based in part on a sum of a disparity factor ($\Delta V$) and a third stage cell group voltage ($V_3$). The cell group is controlled based at least partially on a difference between the measured voltage ($V_M$) and the predicted voltage ($V_P$).

19 Claims, 2 Drawing Sheets

ASSESSMENT OF CELL GROUP HEALTH IN A BATTERY PACK

INTRODUCTION

The present disclosure relates generally to a system and method of assessing cell health in a battery pack. The use of rechargeable energy sources has greatly increased over the last few years. For example, mobile platforms, such as electric vehicles, may use rechargeable energy sources both as an exclusive source of energy and a non-exclusive source of energy. A rechargeable energy storage device with battery packs may store and release electrochemical energy as needed during a given operating mode. This electrochemical energy may be employed for propulsion, heating or cooling a cabin compartment, powering vehicle accessories and other uses.

During the formation of the individual cells of a battery pack, active material may be mixed with polymer binders, conductive additives, and solvents to form a mixture. The mixture may be coated onto a current collector foil and dried to remove the solvent and create a porous electrode coating. During the cell fabrication process and prior to assembly of the battery pack, the homogeneity and structure of the electrode material is tested. After the individual cells are assembled into a module and a number of modules are assembled into a battery pack, testing for various properties of the cells becomes more constrained and challenging.

SUMMARY

Disclosed herein is a system and method for assessing health of a cell group within a module of a battery pack. One or more sensors are configured to obtain a series of respective average cell group voltages, including a first stage cell group voltage ($V_1$) at a first stage, a second stage cell group voltage ($V_2$) at a second stage and a third stage cell group voltage ($V_3$) at a third stage. The first stage occurs prior to the second stage and the second stage occurs prior to the third stage.

The system includes a controller having a processor and tangible, non-transitory memory on which instructions are recorded. Execution of the instructions by the processor causing the controller to obtain a measured voltage ($V_M$) of the cell group at a calibration event occurring after the third stage. The controller is adapted to calculate a predicted voltage ($V_P$) of the cell group based in part on a sum of a disparity factor ($\Delta V$) and the third stage cell group voltage ($V_3$). The cell group is controlled based at least partially on a difference between the measured voltage ($V_M$) and the predicted voltage ($V_P$). Controlling the cell group includes marking the cell group as acceptable for use if the predicted voltage ($V_P$) is less than or equal to the measured voltage ($V_M$). If the predicted voltage ($V_P$) is greater than the measured voltage ($V_M$), the cell group is assigned or designated for further evaluation.

The second stage corresponding to a time of assembly of the module. The third stage corresponds to an end-of-line measurement after the battery pack is assembled. The first stage, the second stage, the third stage and the calibration event correspond to approximately 15, 45, 46 and 60 days, respectively, after manufacture of the cell group. In one example, the cell group includes at least three individual cells.

The disparity factor ($\Delta V$) depends partially upon a first duration ($T_1$), a first set of constants ($\alpha$, $\beta$, $\tau$) and an exponent of a Time Reset Factor (F). The first duration ($T_1$) is a time between the calibration event and the third stage. The first duration ($T_1$) is in days and the disparity factor ($\Delta V$) in millivolts may be calculated as:

$$\Delta V = \frac{T_1}{1000} * \left[ (-\alpha * \tau * e^F) * \frac{(1 - e^{(-\frac{T_1}{\tau})})}{T_1} + \beta \right].$$

In some embodiments, the first duration ($T_1$) is between approximately 10 days and 16 days after assembly of the cell group. The Time Reset Factor (F) depends upon the first stage cell group voltage ($V_1$), the second stage cell group voltage ($V_2$), the third stage cell group voltage ($V_3$), a second duration ($T_2$), and a reset constant ($\gamma$). The second duration ($T_2$) is a time between the first stage and the third stage. If the second duration ($T_2$) is in days, the first stage cell group voltage ($V_1$), the second stage cell group voltage ($V_2$) and the third stage cell group voltage ($V_3$) are in millivolts, the Time Reset Factor (F) may be calculated as:

$$F = 1 + \left[ \frac{V_3 * \gamma * T_2 * (V_3 - V_2)}{1000 * (V_2 - V_1) + T_2} \right].$$

The second duration ($T_2$) may be approximately between 28 days and 32 days after assembly of the cell group. In some embodiments, the predicted voltage ($V_P$) of the cell group is a sum of the disparity factor ($\Delta V$), the third stage cell group voltage ($V_3$), and a Rest Time Adjustment Factor. The Rest Time Adjustment Factor is based on a first duration ($T_1$) and a second set of constants (A, B, C, D), the first duration ($T_1$) being a time between the calibration event and the third stage. The Rest Time Adjustment Factor is determined as: $[A*\ln(T_1)+B*(T_1)^2+C*(T_1)+D]$.

Disclosed herein is a method for assessing health of a cell group within a module of a battery pack in a system having a controller with a processor and tangible, non-transitory memory. The method includes obtaining a data series of respective average cell group voltages, including a first stage cell group voltage ($V_1$) at a first stage, a second stage cell group voltage ($V_2$) at a second stage and a third stage cell group voltage ($V_3$) at a third stage, via one or more sensors, the first stage occurring prior to the second stage and the second stage occurring prior to the third stage. The predicted voltage ($V_P$) of the cell group is calculated based on the data series, the predicted voltage ($V_P$) being a summation of at least a disparity factor ($\Delta V$) and the third stage cell group voltage ($V_3$). The method includes obtaining a measured voltage ($V_M$) of the cell group at a calibration event occurring after the third stage. The cell group is controlled based at least partially on a difference between the measured voltage ($V_M$) and the predicted voltage ($V_P$).

The above features and advantages and other features and advantages of the present disclosure are readily apparent from the following detailed description of the best modes for carrying out the disclosure when taken in connection with the accompanying drawings.

DETAILED DESCRIPTION

Figure 1:
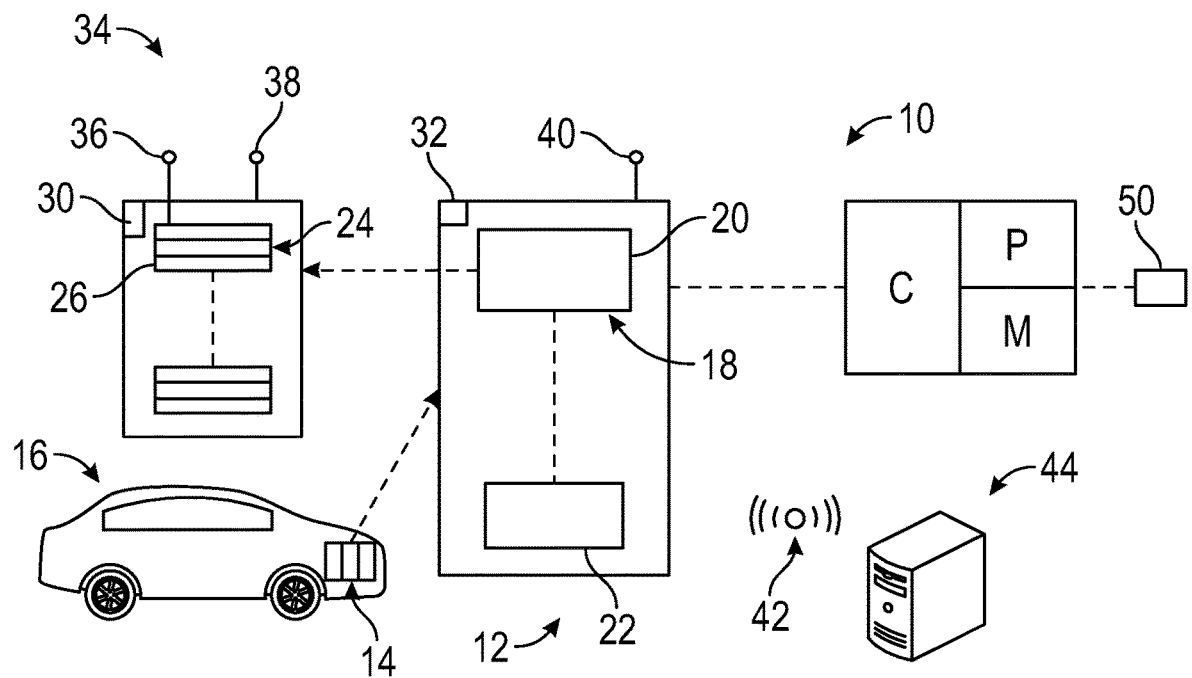
FIG. 1 is a schematic illustration of a system for assessing cell health in a cell group, the system having a controller.

Referring to the drawings, wherein like reference numbers refer to like components, FIG. 1 schematically illustrates a system 10 for assessing the health of portions of a battery pack 12. The battery pack 12 may be used as one of many battery packs in a rechargeable energy storage device 14. In some embodiments, the rechargeable energy storage device 14 is located in an electric vehicle 16. The electric vehicle 16 may be a mobile platform, such as, but not limited to, a passenger vehicle, sport utility vehicle, light truck, heavy duty vehicle, ATV, minivan, bus, transit vehicle, bicycle, moving robot, farm implement (e.g., tractor), sports-related equipment (e.g., golf cart), boat, plane and train. It is to be understood that the electric vehicle 16 may take many different forms and have additional components.

Referring to FIG. 1, the battery pack 12 includes a plurality of modules 18, such as a first module 20 and a second module 22. Each of the plurality of modules 18 has at least one cell group 24 ("one or more" omitted henceforth). Referring to FIG. 1, the cell group 24 is composed of individual cells 26. While the cell group 24 in the example includes three respective cells, the number of cells per cell group, the number of cell groups per module and the number of modules per battery pack may be varied based on the application at hand.

The individual cells 26 may include battery cells having different chemistries, including but not limited to, lithium-ion, lithium-iron, nickel metal hydride and lead acid batteries. The battery pack 12 is first manufactured in sets of electrodes and then assembled into the individual cells 26, which are then assembled into the plurality of modules 18 to form the battery pack 12. After the cell group 24 is assembled into the first module 20 and the battery pack 12, testing for various properties of the cell group 24 becomes more constrained and challenging.

Referring to FIG. 1, the system 10 includes a controller C having at least one processor P and at least one memory M (or non-transitory, tangible computer readable storage medium) on which instructions are recorded for executing a method 100 for assessing health of the cell group 24, after the cell group 24 is assembled into the first module 20 and the battery pack 12. Method 100 is described below with respect to FIG. 2. The memory M can store executable instruction sets, and the processor P can execute the instruction sets stored in the memory M.

The system 10 accounts for ambient or environmental noise factors to predict an acceptable discharge rate for an example cell group. The noise factors may include age after formation, charge neutrality at the pack level, charge level at an end-of-line measurement, change in charge from module assembly (assembly of the cell groups 24 into the first module 20) to pack assembly (assembly of the plurality of modules 18 into the battery pack 12), variation in charge within the cell group 24, formation temperature, storage temperature, charge neutrality at the module level, respective measurement accuracy at various stages and a calibration event. An accurate assessment of cell health is made by comparing the predicted discharge rate to an observed discharge rate.

The system 10 provides for robust monitoring of various cell groups in the battery pack 12, without the need to disassemble the components of the battery pack 12, and results in improved detection of defective cell groups. The system 10 may be implemented prior to usage of the battery pack 12 in an electric device, such as the electric vehicle 16 of FIG. 1.

Referring to FIG. 1, each of the plurality of modules 18 may include a module management unit 30 respectively embedded within. The module management unit 30 is configured to store one or more parameters pertaining to the module as a whole or the individual cells 26 in the module, such as voltages from each of the cell groups 24, module current and module temperature. Similarly, the battery pack 12 may include a pack management unit 32 embedded within and adapted to measure/store various parameters. The module management unit 30 and pack management unit 32 may be adapted to interface with the controller C.

The controller C is specifically configured to execute the blocks of method 100 and may receive input from one or more measuring devices or sensors 34. Referring to FIG. 1, the sensors 34 may include a pack sensor 36, a module sensor 38 and a cell group sensor 40. The sensors 34 may be configured to obtain data related to temperature, voltage, current, state of charge, capacity, state of health and other factors of different components of the battery pack 12. Sensor technologies available to those skilled in the art may be employed.

Referring to FIG. 1, the sensors 34 may be in communication with the controller C via a wireless network 42, which may be a short-range network or a long-range network. The wireless network 42 may be a communication BUS, which may be in the form of a serial Controller Area Network (CAN-BUS). The wireless network 42 may be a Wireless Local Area Network (LAN) which links multiple devices using a wireless distribution method, a Wireless Metropolitan Area Networks (MAN) which connects several wireless LANs or a Wireless Wide Area Network (WAN) which covers large areas such as neighboring towns and cities. Other types of connections may be employed.

Figure 2:
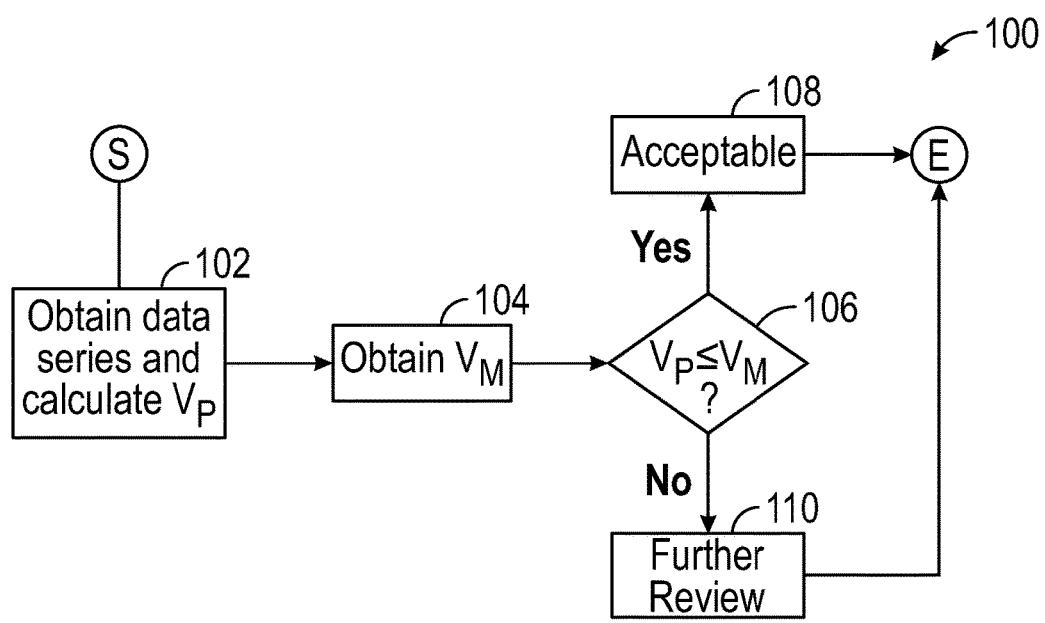
FIG. 2 is a schematic flow diagram of a method implemented by the system of FIG. 1.

Referring now to FIG. 2, a flowchart of the method 100 for assessing health of the cell group 24 is shown. Method 100 may be stored on and executable by the controller C of FIG. 1. The method 100 need not be applied in the specific order recited herein and may be dynamically executed. Furthermore, it is to be understood that some steps may be eliminated. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

Per block 102 of FIG. 2, the controller C obtains a data series of respective average cell group voltages, via the sensors 34. The data series is obtained over several stages of testing/diagnostic spread out over time. The data series includes a first stage cell group voltage ($V_1$) at a first stage, a second stage cell group voltage ($V_2$) at a second stage and a third stage cell group voltage ($V_3$) at a third stage. The first stage occurs prior to the second stage and the second stage occurs prior to the third stage. Table 1 below shows a non-limiting example of a timeline for the first stage, second stage, third stage and a calibration event, respectively, after assembly of the cell group 24.

TABLE 1

|  | First Stage | Second Stage | Third Stage | Calibration event |
|---|---|---|---|---|
| Time (days) | 15 | 45 | 46 | 60 |

In one example, the first stage corresponds to an open circuit voltage of the cell group 24 prior to the cell group 24 being assembled into the first module 20. The second stage may correspond to a time of assembly of the first module 20, i.e., when the cell group 24 (and other cell groups) are assembled to form the first module 20. The third stage may correspond to an end-of-line (EOL) measurement after the battery pack 12 is assembled, i.e., when the plurality of modules 18 are assembled to form the battery pack 12. The end-of-line (EOL) measurement refers to testing done before the end of the manufacturing line is reached once the battery pack 12 is assembled.

Also, per block 102 of FIG. 2, the controller C calculates a predicted voltage ($V_P$) of the cell group 24 based in part on the data series. As described below, the predicted voltage ($V_P$) is used to distinguish between respective data sets characterizing unacceptable devices and acceptable devices according to a predefined standard. The predicted voltage ($V_P$) is at least a sum of a disparity factor ($\Delta V$) and the third stage cell group voltage ($V_3$). In some embodiments, the predicted voltage ($V_P$) is a sum of the disparity factor ($\Delta V$) and the respective voltage at the third stage ($V_3$), and such that:

$$[V_P = \Delta V + V_3].$$

The disparity factor ($\Delta V$) depends partially upon a first duration ($T_1$), a first set of constants ($\alpha$, $\beta$, $\tau$) and an exponent of a Time Reset Factor (F). Here, the first duration ($T_1$) is a time between the calibration event and the third stage. In one example, the first duration ($T_1$) is between approximately 10 days and 16 days after manufacture of the cell group 24. In one example, the first set of constants ($\alpha$, $\beta$, $\tau$) have the following respective values: [0.5, −0.10, 15]. With the first duration ($T_1$) being in the unit of days, the disparity factor ($\Delta V$) is calculated as:

$$\Delta V = \frac{T_1}{1000} * \left[ (-\alpha * \tau * e^F) * \frac{\left(1 - e^{\left(-\frac{T_1}{\tau}\right)}\right)}{T_1} + \beta \right].$$

The Time Reset Factor (F) depends upon the first stage cell group voltage ($V_1$), the second stage cell group voltage ($V_2$), the third stage cell group voltage ($V_3$), a second duration ($T_2$), and a reset constant ($\gamma$). The second duration ($T_2$) is the time between the first stage and the third stage. In one example, the second duration ($T_2$) is approximately between 28 days and 32 days after manufacture of the cell group. In one example, the reset constant ($\gamma$) is 0.9. If the second duration ($T_2$) is in days, the first stage cell group voltage ($V_1$), the second stage cell group voltage ($V_2$) and the third stage cell group voltage ($V_3$) are in millivolts, the Time Reset Factor (F) may be calculated as:

$$F = 1 + \left[ \frac{V_3 * \gamma * T_2 * (V_3 - V_2)}{1000 * (V_2 - V_1) + T_2} \right].$$

In some embodiments, the predicted voltage ($V_P$) is a sum of the disparity factor ($\Delta V$), the respective voltage at the third stage ($V_3$), and a Rest Time Adjustment Factor such that:

$$V_P = \Delta V + V_3 + \text{Rest Time Adjustment Factor}.$$

The Rest Time Adjustment Factor is based on the first duration ($T_1$) and a second set of constants (A, B, C, D). In one example, the second set of constants (A, B, C, D) has the following values: [0.01, 2.0e-06, −0.0005, −0.02]. The Rest Time Adjustment Factor is determined as:

$$[A*\ln(T_1) + B*(T_1)^2 + C*(T_1) + D].$$

The first set of constants ($\alpha$, $\beta$, $\tau$), the second set of constants (A, B, C, D) and the reset constant ($\gamma$) may be obtained using various methods available to those skilled in the art, including but not limited to, empirical-based regression models, numerical simulations, design of experiments and machine learning models. Referring to FIG. 1, the controller C may access the machine learning model 50 from a cloud unit or remote server 44, via the network 42. Alternatively, the machine learning model 50 may be embedded in the controller C. The machine learning model 50 may be configured to find parameters, weights or a structure that minimizes a respective cost function. The machine learning model 50 may include a neural network, such as a feedforward artificial neural network having an input layer, at least one hidden layer and an output layer. The machine learning model 50 may be trained with a training set of cell groups having paired values of the data series and the predicted voltage available, which are entered into the input layer, such that the output layer produces the first set of constants ($\alpha$, $\beta$, $\tau$), the second set of constants (A, B, C, D) and the reset constant ($\gamma$). The machine learning model 50 may incorporate multiple regression models.

Figure 3:
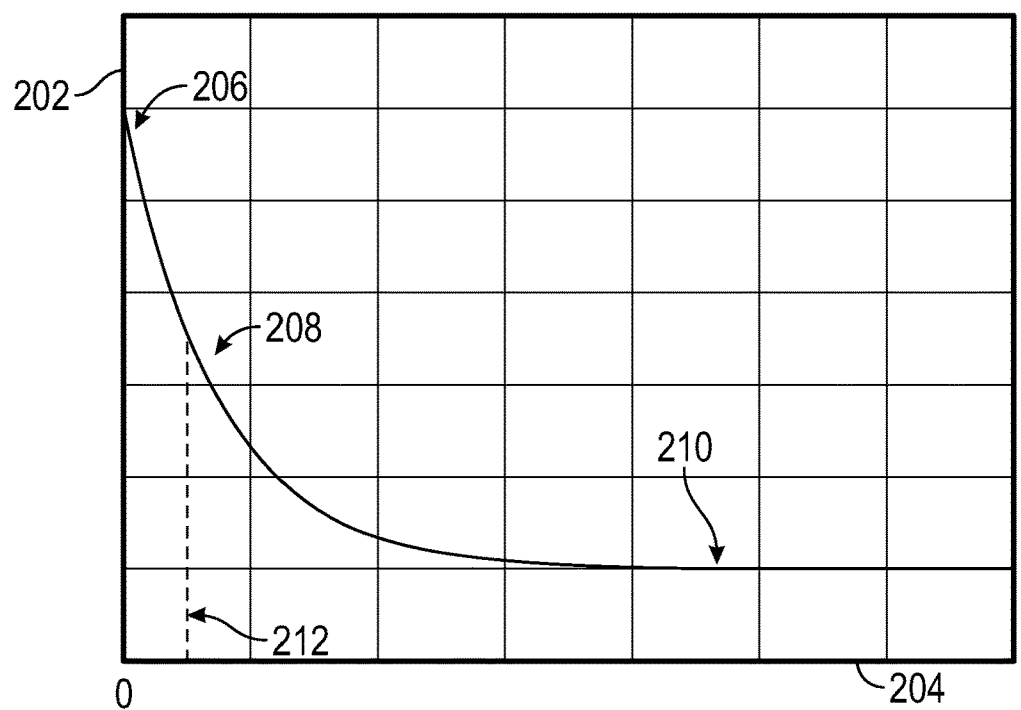
FIG. 3 is a schematic graph of a self-discharge curve for an example cell group, showing instantaneous self-discharge rate on the vertical axis and time on the horizontal axis.

The first set of constants ($\alpha$, $\beta$, $\tau$) may be obtained by regression modeling of a self-discharge rate of the cell group 24. FIG. 3 shows a schematic graph of an example self-discharge rate curve. The vertical axis 202 shows an instantaneous self-discharge rate (dV/dt) while the horizontal axis 204 shows time (t). The first set of constants includes an early cycle constant ($\alpha$), a late cycle constant ($\beta$) and a time constant ($\tau$). The self-discharge rate may be modelled as follows:

$$\frac{dV}{dt} = [\alpha * e^{-t/\tau} + \beta].$$

Referring to FIG. 3, at location 206 (corresponding to time=0), the self-discharge rate corresponds to (dV/dt=$\alpha$+$\beta$). At location 210 (corresponding to time going to infinity), the self-discharge rate corresponds to (dV/dt=$\beta$). The time constant ($\tau$) connects the early cycle constant ($\alpha$) and the late cycle constant ($\beta$). Referring to FIG. 3, at location 208 (corresponding to time t=$\tau$), the contribution of the early cycle constant ($\alpha$) to the self-discharge rate drops by 63.2%. In one example, the first stage is selected to be prior to or at time t=$\tau$. For example, line 212 (occurring prior to time t=$\tau$) may correspond to the first stage.

Referring now to FIG. 2, per block 104, the controller C obtains a measured voltage ($V_M$) of the cell group 24 at a calibration event occurring after the third stage. In some embodiments, the calibration event is set to be between 7 and 21 days after the third stage. In some embodiments, the calibration event is set to be exactly 14 days after the third stage. The method 100 then proceeds to block 104.

Per block 106, the controller C is configured to determine if the predicted voltage ($V_P$) is less than or equal to the measured voltage ($V_m$). Operation of the cell group 24 is controlled based at least partially on a difference between the measured voltage ($V_M$) and the predicted voltage ($V_P$). If the predicted voltage ($V_P$) is less than or equal to the measured voltage ($V_m$), the method 100 proceeds to block 108, where controlling the cell group 24 includes marking the cell group 24 as acceptable for use, and the method 100 is ended. If the predicted voltage ($V_P$) is greater than the measured voltage ($V_m$), the method 100 proceeds to block 110, where controlling the cell group 24 includes assigning the cell group 24 for further evaluation, and the method 100 is ended. In other words, the controller C may be programmed to run further diagnostic tests and/or ascertain whether remedial action is warranted.

Figure 4:
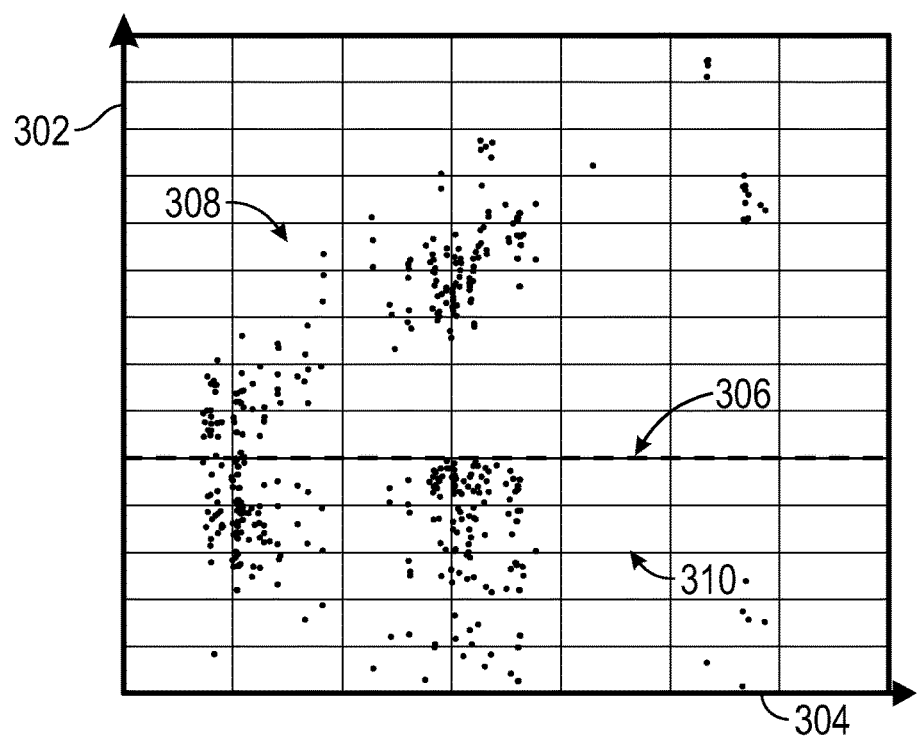
FIG. 4 is a schematic visualization of data obtained for a plurality of cell groups, with the vertical axis showing the difference between measured voltage and predicted voltage for each cell group and the horizontal axis showing the sequence of cell groups.

Referring now to FIG. 4, a schematic visualization of data obtained for a plurality of cell groups in a dataset is shown. The vertical axis 302 shows the difference between the predicted voltage ($V_P$) and the measured voltage ($V_m$). The horizontal axis 304 shows the sequence of cell groups. The horizontal axis is plotted in time (days). Line 306 indicates where the predicted voltage ($V_P$) is equal to the measured voltage ($V_m$). Referring to FIG. 4, the tested cell groups that fall in a first data set 308 (defined to be at or above the line 306) are deemed to be acceptable and the tested cell groups that fall in a second data set 310 (defined to be below the line 306) are deemed to be unacceptable.

In summary, the system 10 (via execution of the method 100) accounts for ambient noise factors, including factors that affect cells both during the assembly process and upstream cell production processes. The system 10 reduces evaluation time of the cell group 24, which in turn lowers the manufacturing cost of the battery pack 12. The system 10 improves the detection of defective cell groups in a battery pack 12. Accordingly, the system 10 improves the functioning of the battery pack 12.

The flowchart in FIG. 2 illustrate an architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by specific purpose hardware-based energy systems that perform the specified functions or acts, or combinations of specific purpose hardware and computer instructions. These computer program instructions may also be stored in a computer-readable medium that can direct a controller or other programmable data processing apparatus to function in a particular manner, such that the instructions stored in the computer-readable medium produce an article of manufacture including instructions to implement the function/act specified in the flowchart and/or block diagram blocks.

The controller C includes a computer-readable medium (also referred to as a processor-readable medium), including a non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, other magnetic media, a CD-ROM, DVD, other optical media, punch cards, paper tape, other physical media with patterns of holes, a RAM, a PROM, an EPROM, a FLASH-EEPROM, other memory chips or cartridges, or other media from which a computer can read.

Look-up tables, databases, data repositories or other data stores described herein may include various kinds of mechanisms for storing, accessing, and retrieving various kinds of data, including a hierarchical database, a set of files in a file energy system, an application database in a proprietary format, a relational database energy management energy system (RDBMS), etc. Each such data store may be included within a computing device employing a computer operating system such as one of those mentioned above and may be accessed via a network in one or more of a variety of manners. A file system may be accessible from a computer operating energy system and may include files stored in various formats. An RDBMS may employ the Structured Query Language (SQL) in addition to a language for creating, storing, editing, and executing stored procedures, such as the PL/SQL language mentioned above.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. A system for assessing health of a cell group within a module of a battery pack, the system comprising:

one or more sensors configured to obtain a data series of respective average cell group voltages, including a first stage cell group voltage ($V_1$) at a first stage, a second stage cell group voltage ($V_2$) at a second stage and a third stage cell group voltage ($V_3$) at a third stage, the first stage occurring prior to the second stage and the second stage occurring prior to the third stage;

a controller having a processor and tangible, non-transitory memory on which instructions are recorded, execution of the instructions by the processor causing the controller to:

obtain the data series and calculate a predicted voltage ($V_P$) of the cell group based on the data series, the predicted voltage ($V_P$) being a summation of at least a disparity factor ($\Delta V$) and the third stage cell group voltage ($V_3$);

obtain a measured voltage ($V_M$) of the cell group at a calibration event occurring after the third stage; and control the cell group based at least partially on a difference between the measured voltage ($V_M$) and the predicted voltage ($V_P$); and wherein the first stage, the second stage and the third stage are discrete events, the second stage corresponding to a time of assembly of the module and the third stage corresponding to an end-of-line measurement after the battery pack is assembled.

2. The system of claim 1, wherein:
controlling the cell group includes marking the cell group as acceptable for use if the predicted voltage ($V_P$) is less than or equal to the measured voltage ($V_M$).

3. The system of claim 2, wherein:
controlling the cell group includes assigning the cell group for further evaluation if the predicted voltage ($V_P$) is greater than the measured voltage ($V_M$).

4. The system of claim 1, wherein the first stage, the second stage, the third stage and the calibration event occur at approximately 15, 45, 46 and 60 days, respectively, after manufacture of the cell group.

5. The system of claim 1, wherein the cell group includes at least three individual cells.

6. The system of claim 1, wherein:
the disparity factor ($\Delta V$) depends partially upon a first duration ($T_1$), a first set of constants ($\alpha$, $\beta$, $\tau$) and an exponent of a Time Reset Factor (F); and
the first duration ($T_1$) is a time between the calibration event and the third stage.

7. The system of claim 6, wherein:
the first duration ($T_1$) is in days and the disparity factor ($\Delta V$) in millivolts is calculated as:

$$\Delta V = \frac{T_1}{1000} * \left[ (-\alpha * \tau * e^F) * \frac{\left(1 - e^{\left(-\frac{T_1}{\tau}\right)}\right)}{T_1} + \beta \right].$$

8. The system of claim 6, wherein the first duration ($T_1$) is between approximately 10 days and 16 days after assembly of the cell group.

9. The system of claim 6, wherein:
the Time Reset Factor (F) depends upon the first stage cell group voltage ($V_1$), the second stage cell group voltage ($V_2$), the third stage cell group voltage ($V_3$), a second duration ($T_2$), and a reset constant ($\gamma$); and
the second duration ($T_2$) is a time between the first stage and the third stage.

10. The system of claim 9, wherein:
the second duration ($T_2$) is in days, the first stage cell group voltage ($V_1$), the second stage cell group voltage ($V_2$) and the third stage cell group voltage ($V_3$) are in millivolts and the Time Reset Factor (F) is calculated as:

$$F = 1 + \left[\frac{V_3 * \gamma * T_2 * (V_3 - V_2)}{1000 * (V_2 - V_1) + T_2}\right].$$

11. The system of claim 9, wherein the second duration ($T_2$) is approximately between 28 days and 32 days after assembly of the cell group.

12. The system of claim 1, wherein:
the predicted voltage ($V_P$) of the cell group is a sum of the disparity factor ($\Delta V$), the third stage cell group voltage ($V_3$), and a Rest Time Adjustment Factor; and
the Rest Time Adjustment Factor is based on a first duration ($T_1$) and a second set of constants (A, B, C, D), the first duration ($T_1$) being a time between the calibration event and the third stage.

13. The system of claim 12, wherein the Rest Time Adjustment Factor is determined as: $[A*\ln(T_1)+B*(T_1)^2+C*(T_1)+D]$.

14. A method for assessing health of a cell group within a module of a battery pack in a system having a controller with a processor and tangible, non-transitory memory, the method comprising:
obtaining a data series of respective average cell group voltages, including a first stage cell group voltage ($V_1$) at a first stage, a second stage cell group voltage ($V_2$) at a second stage and a third stage cell group voltage ($V_3$) at a third stage, via one or more sensors, the first stage occurring prior to the second stage and the second stage occurring prior to the third stage, the first stage, the second stage and the third stage being discrete events, the second stage corresponding to a time of assembly of the module and the third stage corresponding to an end-of-line measurement after the battery pack is assembled;
calculating a predicted voltage ($V_P$) of the cell group based on the data series, the predicted voltage ($V_P$) being a summation of at least a disparity factor ($\Delta V$) and the third stage cell group voltage ($V_3$);
obtaining a measured voltage ($V_M$) of the cell group at a calibration event occurring after the third stage; and
controlling the cell group based at least partially on a difference between the measured voltage ($V_M$) and the predicted voltage ($V_P$).

15. The method of claim 14, wherein controlling the cell group includes:
marking the cell group as acceptable for use if the predicted voltage ($V_P$) is less than or equal to the measured voltage ($V_M$); and
assigning the cell group for further evaluation if the predicted voltage ($V_P$) is greater than the measured voltage ($V_M$).

16. The method of claim 14, further comprising:
determining the disparity factor ($\Delta V$) based at least partially upon a first duration ($T_1$), a first set of constants ($\alpha$, $\beta$, $\tau$) and an exponent of a Time Reset Factor (F), the first duration ($T_1$) being a time between the calibration event and the third stage.

17. The method of claim 16, further comprising:
determining the Time Reset Factor (F) based on the first stage cell group voltage ($V_1$), the second stage cell group voltage ($V_2$), the third stage cell group voltage ($V_3$), a second duration ($T_2$), and a reset constant ($\gamma$), the second duration ($T_2$) being a time between the first stage and the third stage.

18. The method of claim 14, further comprising:
determining the predicted voltage ($V_P$) of the cell group as a sum of the disparity factor ($\Delta V$), the third stage cell group voltage ($V_3$), and a Rest Time Adjustment Factor, the Rest Time Adjustment Factor is based on a second set of constants (A, B, C, D) and a first duration ($T_1$) between the calibration event and the third stage.

19. A system for assessing health of a cell group within a module of a battery pack, the system comprising:
one or more sensors configured to obtain a data series of respective average cell group voltages, including a first stage cell group voltage ($V_1$) at a first stage, a second stage cell group voltage ($V_2$) at a second stage and a third stage cell group voltage ($V_3$) at a third stage, the first stage occurring prior to the second stage and the second stage occurring prior to the third stage;

a controller having a processor and tangible, non-transitory memory on which instructions are recorded, execution of the instructions by the processor causing the controller to:

obtain the data series and calculate a predicted voltage ($V_P$) of the cell group based on the data series, the predicted voltage ($V_P$) being a summation of at least a disparity factor ($\Delta V$) and the third stage cell group voltage ($V_3$);

obtain a measured voltage ($V_M$) of the cell group at a calibration event occurring after the third stage; and control the cell group based at least partially on a difference between the measured voltage ($V_M$) and the predicted voltage ($V_P$);

wherein the predicted voltage ($V_P$) of the cell group is a sum of the disparity factor ($\Delta V$), the third stage cell group voltage ($V_3$), and a Rest Time Adjustment Factor;

wherein the Rest Time Adjustment Factor is based on a first duration ($T_1$) and a second set of constants (A, B, C, D), the first duration ($T_1$) being a time between the calibration event and the third stage, the Rest Time Adjustment Factor being determined as: $[A*\ln(T_1)+B*(T_1)^2+C*(T_1)+D]$.

* * * * *